(12) United States Patent
Xia

(10) Patent No.: US 11,959,503 B2
(45) Date of Patent: Apr. 16, 2024

(54) AIRFLOW REGULATION AND CONTROL APPARATUS AND SERVER

(71) Applicant: INSPUR ELECTRONIC INFORMATION INDUSTRY CO., LTD., Shandong (CN)

(72) Inventor: Jicheng Xia, Shandong (CN)

(73) Assignee: INSPUR ELECTRONIC INFORMATION INDUSTRY CO., LTD., Shandong (CN)

(*) Notice: Subject to any disclaimer, the term of this patent is extended or adjusted under 35 U.S.C. 154(b) by 0 days.

(21) Appl. No.: 18/254,503

(22) PCT Filed: Sep. 28, 2021

(86) PCT No.: PCT/CN2021/121212
§ 371 (c)(1),
(2) Date: May 25, 2023

(87) PCT Pub. No.: WO2022/174591
PCT Pub. Date: Aug. 25, 2022

(65) Prior Publication Data
US 2023/0340975 A1    Oct. 26, 2023

(30) Foreign Application Priority Data
Feb. 19, 2021    (CN) .......... 202110189468.X

(51) Int. Cl.
*F15D 1/00*     (2006.01)
*H05K 7/20*     (2006.01)

(52) U.S. Cl.
CPC .......... *F15D 1/006* (2013.01); *F15D 1/0005* (2013.01); *H05K 7/20145* (2013.01); *H05K 7/20727* (2013.01)

(58) Field of Classification Search
CPC ... F15D 1/006; F15D 1/0005; H05K 7/20145; H05K 7/20727
(Continued)

(56) References Cited

U.S. PATENT DOCUMENTS 7,167,363 B1    1/2007   Cushman et al.
8,081,453 B2 *  12/2011  Sun .......................... G06F 1/20
                                                    165/104.33
(Continued)

FOREIGN PATENT DOCUMENTS

CN    204302908 U    4/2015
CN    106369562 A    2/2017
(Continued)

OTHER PUBLICATIONS

International search report for PCT/CN2021/121212 dated Dec. 1, 2021.
(Continued)

*Primary Examiner* — Steven B McAllister
*Assistant Examiner* — Charles R Brawner
(74) *Attorney, Agent, or Firm* — Dennemeyer & Associates LLC; Victoria Friedman

(57) ABSTRACT

The disclosure provides an airflow regulation and control apparatus. A ventilation hole is formed in a windshield in a penetrating manner; a rectangular plate is mounted on the windshield; the rectangular plate is lifted by means of power provided by a lifting wing disposed thereon, and the height of the rectangular plate when moving upwards exceed the height of an upper edge of a main body portion of the windshield; when wind strength is low, the rectangular plate is located at a lower portion under the action of gravity and shields the ventilation hole; when the wind strength is increased, the lifting wing is blown by an airflow to generate upwards lifting force, and drives the rectangular plate to
(Continued)

moved upwardly so as to shield an opening in an upper portion of the windshield and block the airflow.

20 Claims, 4 Drawing Sheets

(58) Field of Classification Search
USPC .......................................................... 454/184
See application file for complete search history.

(56) References Cited

U.S. PATENT DOCUMENTS

| | | | |
|---|---|---|---|
| 8,851,831 B2* | 10/2014 | Sun | ............... H05K 7/20172 454/351 |
| 2012/0020013 A1* | 1/2012 | Li | ............................ G06F 1/20 138/46 |

FOREIGN PATENT DOCUMENTS

| | | |
|---|---|---|
| CN | 205939056 U | 2/2017 |
| CN | 209470204 U | 10/2019 |
| CN | 210438841 U | 5/2020 |
| CN | 111655012 A | 9/2020 |
| CN | 211720985 U | 10/2020 |
| CN | 112290423 A | 1/2021 |
| CN | 113007185 A | 6/2021 |
| JP | 2006010154 A | 1/2006 |
| JP | 2012017750 A | 1/2012 |
| JP | 2013008085 A | 1/2013 |

OTHER PUBLICATIONS

Office action for Chinese application No. 202110189468.X filed on Feb. 19, 2021.

* cited by examiner

AIRFLOW REGULATION AND CONTROL APPARATUS AND SERVER

CROSS-REFERENCE TO RELATED APPLICATION

The present disclosure is a National Stage Filing of the PCT International Application No. PCT/CN2021/121212 filed on Sep. 28, 2021, which claims priority to Chinese Patent Application No. 202110189468.X filed to the China National Intellectual Property Administration on Feb. 19, 2021 and entitled "Airflow Regulation and Control Apparatus and Server", the disclosure of which is hereby incorporated by reference in its entirety.

TECHNICAL FIELD

The present disclosure relates to the technical field of heat dissipation, and further relates to an airflow regulation and control apparatus. In addition, the present disclosure further relates to a server.

BACKGROUND

Devices in a server generate much heat when running, so heat dissipation needs be performed in time to ensure normal work. At present, a common cooling manner is air cooling, and a plurality of fans blow air to an electronic component to achieve the purpose of heat dissipation. The revolving speed of the fan in the server changes according to temperature. The higher the temperature is, the higher the revolving speed is, and airflow per unit time speeds up to cool.

Different electronic components in the whole server have different requirements for heat dissipation. Some electronic components have high calorific values, so more air volume is needed for heat dissipation. Some electronic components do not have too high requirements for the air volume. However, different components are located in the same space, and there is basically no difference in the airflow. During heat dissipation, the airflow is mainly controlled based on the components with the largest calorific value, and the components with less demand for the airflow are blown by the same airflow, thus causing waste of excessive airflow and increasing the overall heat dissipation energy consumption of the device.

For those skilled in the art, how to better distribute the airflow, make the airflow meet the demand and reduce energy consumption is a technical problem to be solved at present.

SUMMARY

The present disclosure provides an airflow regulation and control apparatus, which may block airflow, so that excess airflow may be blown to a structure with a higher calorific value for heat dissipation, and the airflow is better distributed. A specific solution is as follows.

An airflow regulation and control apparatus include a windshield. A ventilation hole is formed in the windshield in a penetrating manner.

A rectangular plate is slidingly mounted on the windshield, and the rectangular plate is able to move vertically relative to the windshield.

A lifting wing is arranged on the rectangular plate. The lifting wing is blown by an airflow to generate upward lifting force, and drives the rectangular plate to moved upwardly so as to shield an opening in an upper portion of the windshield and block the airflow, so that the airflow flows through the ventilation hole and an upper portion and both sides of a wind blocking surface defined by the windshield and the rectangular plate.

In an embodiment mode, an upper surface of the lifting wing is a curved surface and a lower surface of the lifting wing is a flat surface.

In an embodiment mode, there are two lifting wings, the two lifting wings are respectively located at both sides of the rectangular plate, and a height of the lifting wings is lower than a height of an upper edge of the rectangular plate.

In an embodiment mode, the windshield is arranged in two layers, and the rectangular plate is sandwiched between the two layers.

In an embodiment mode, both sides of the windshield protrude upwards and are provided with a guide rail, and the guide rail may limit the highest position of the rectangular plate.

In an embodiment mode, a width of the ventilation hole is less than one third of a width of the windshield, a height of the ventilation hole is less than a height of the windshield, and a top end of the ventilation hole is communicated with the outside.

In an embodiment mode, a base is arranged on a lower surface of the windshield, and a thickness of the base is greater than a thickness of the windshield.

In an embodiment mode, both ends of the base in a length direction respectively extend out of the windshield to form connecting lugs, and the windshield is fixed to a main board in a bolted manner through the connecting lugs.

The present disclosure also provides a server, including any airflow regulation and control apparatus described above.

In an embodiment mode, one side or both sides of the windshield are provided with a flow guiding cover, and the flow guiding cover is configured to lead the airflow to blow to a component with a higher calorific value.

The present disclosure provides the airflow regulation and control apparatus. The ventilation hole is formed in the windshield in a penetrating manner, and the dimension of the ventilation hole is smaller than the dimension of the wind blocking surface of the windshield; the rectangular plate is slidingly mounted on the windshield, the rectangular plate is able to move vertically relative to the windshield, the rectangular plate is lifted by means of power provided by the lifting wing disposed thereon, and the height of the rectangular plate when moving upwards exceed the height of an upper edge of a main body portion of the windshield; when wind strength is low, the rectangular plate is located at a lower portion under the action of gravity and shields the ventilation hole; when the wind strength is increased, the lifting wing is blown by the airflow to generate upward lifting force, and drives the rectangular plate to moved upwardly so as to shield an opening in an upper portion of the windshield and block the airflow; and after part of the airflow blows to the windshield through the ventilation mesh hole, the excess airflow flows through the upper portion and both sides of a whole wind blocking surface defined by the windshield and the rectangular plate. In the present disclosure, by blocking part of the airflow and reducing the airflow blowing to the rear of the windshield, more airflow is transferred to other positions, the airflow is better distributed, and the airflow meets the requirements of various components for the cooling airflow, so that an effect of reducing energy consumption is achieved.

BRIEF DESCRIPTION OF THE DRAWINGS

In order to more clearly explain the technical solutions in the embodiments of this application or in a traditional art, the drawings required in the descriptions of the embodiments or the traditional art will be briefly introduced below. It is apparent that the drawings in the following descriptions are only some embodiments of this application. Those of ordinary skill in the art may also obtain other drawings in accordance with these drawings without paying creative labor.

The figure includes.

Figure 1:
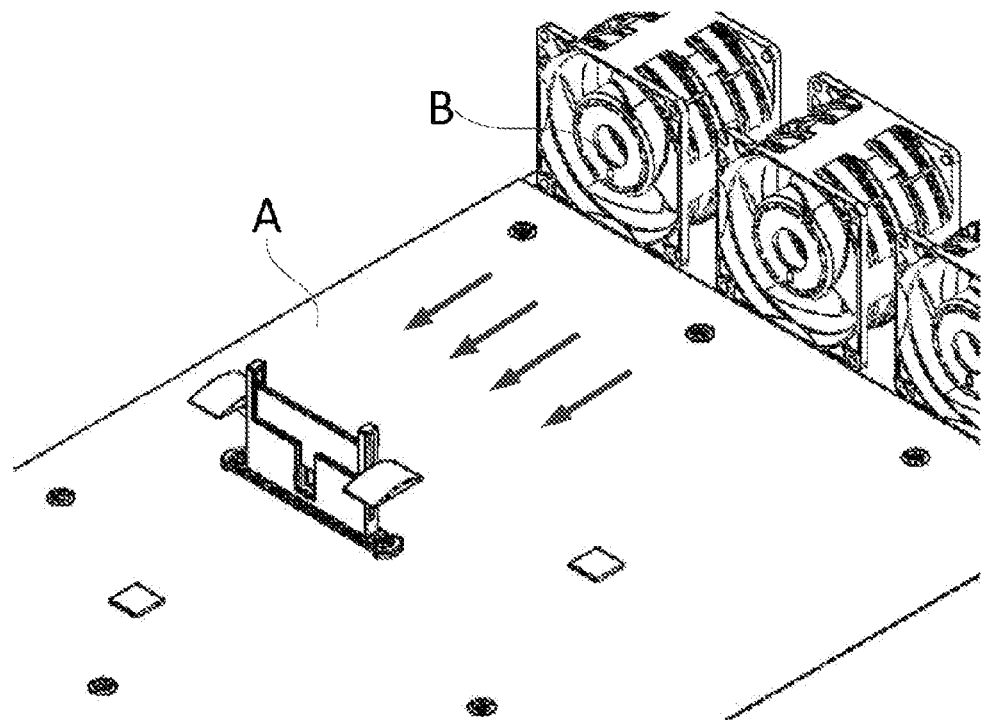
FIG. 1 is a schematic structural diagram of an airflow regulation and control apparatus mounted on a main board according to the present disclosure.

windshield 1, ventilation hole 11, guide rail 12, base 13, rectangular plate 2 and lifting wing 3.

DETAILED DESCRIPTION OF THE EMBODIMENTS

The present disclosure aims to provide an airflow regulation and control apparatus, which may block airflow, so that the excess airflow may be blown to a structure with a higher calorific value for heat dissipation, and the airflow is better distributed.

In order to enable those skilled in the art to have a better understanding of the technical solution of the present disclosure, the airflow regulation and control apparatus of the present disclosure will be described in details below with reference to accompanying drawings and specific implementations.

Figure 2:
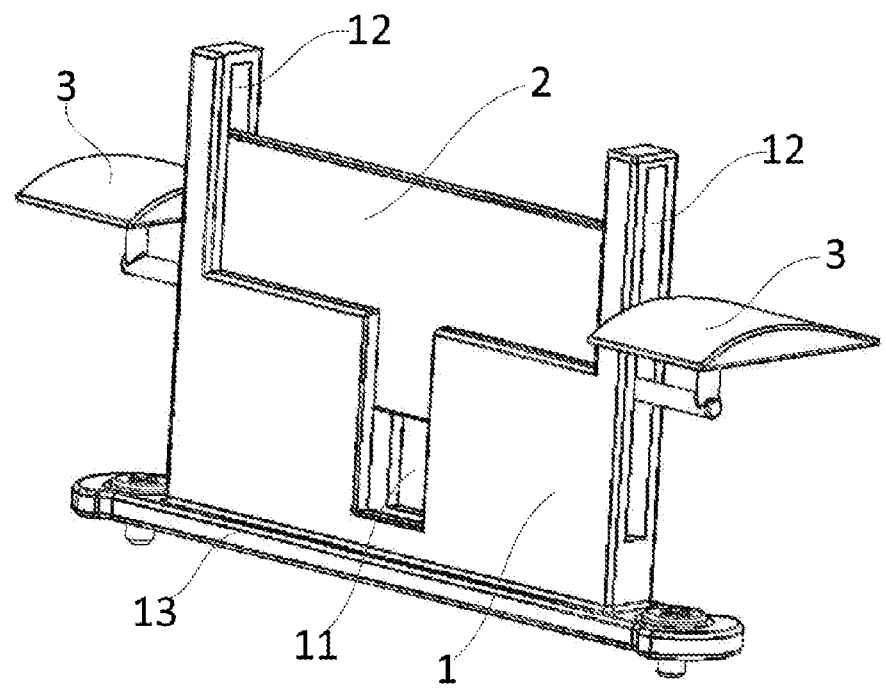
FIG. 2 is a schematic structural diagram of an airflow regulation and control apparatus according to the present disclosure.

As shown in FIG. 1, which is a schematic structural diagram of an airflow regulation and control apparatus mounted on a main board according to the present disclosure, A in the figure indicates the main board, B indicates a fan, and the arrow indicates airflow. FIG. 2 is a schematic structural diagram of the airflow regulation and control apparatus according to the present disclosure. The airflow regulation and control apparatus of the present disclosure includes a windshield 1, the windshield 1 is fixedly arranged, the windshield 1 is approximately perpendicular to the surface of the main board, and the windshield 1 may play a role in blocking the airflow.

The airflow regulation and control apparatus in the present disclosure is used to reduce the airflow behind the apparatus to realize redistribution of the airflow, which is especially suitable for components with different calorific values. The present disclosure is mainly described in combination with the components with different calorific values: the airflow regulation and control apparatus is arranged in front of a component with a relatively small calorific value and plays a role in blocking the airflow blowing to the component. When the calorific value is small, the heat dissipation requirement of the component may be met only by the airflow bypassing the windshield 1, and other airflow bypasses the windshield 1 and shifts to other positions.

A ventilation hole 11 is formed in the windshield 1 in a penetrating manner, a penetrating direction of the ventilation hole 11 is perpendicular to a wind blocking surface of the windshield 1, a vertical height of the ventilation hole 11 is approximately equal to a height of the windshield 1, and a width of the ventilation hole 11 is smaller than a width of the windshield 1.

When air force is low, a rectangular plate 2 is kept at a lower portion under an action of gravity, the rectangular plate 2 overlaps with the windshield 1, and the rectangular plate 2 partially or completely shields the ventilation hole 11. Usually, a height of the rectangular plate 2 is smaller than the height of the windshield 1, and the rectangular plate 2 is not higher than the windshield 1 when falling to the lowest position.

The rectangular plate 2 is slidingly mounted on the windshield 1. The rectangular plate 2 is able to move vertically relative to the windshield 1, and the rectangular plate 2 is guided and limited, and may only move vertically, but may not translate in a direction perpendicular to the wind blocking surface of the windshield 1.

Figure 3A:
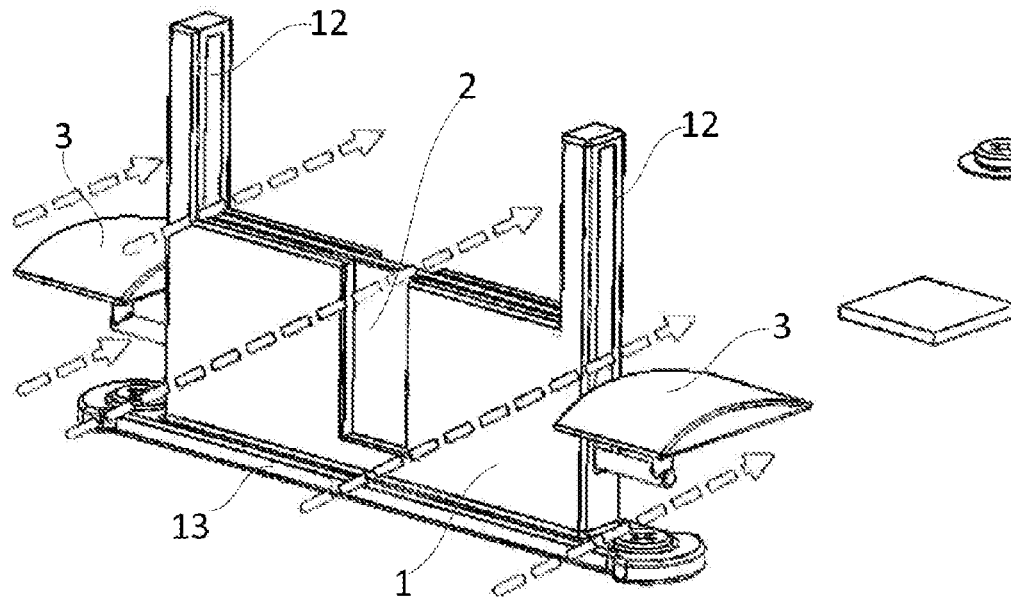
FIG. 3A is a schematic structural diagram of an airflow regulation and control apparatus blown by an airflow according to the present disclosure.
Figure 3B:
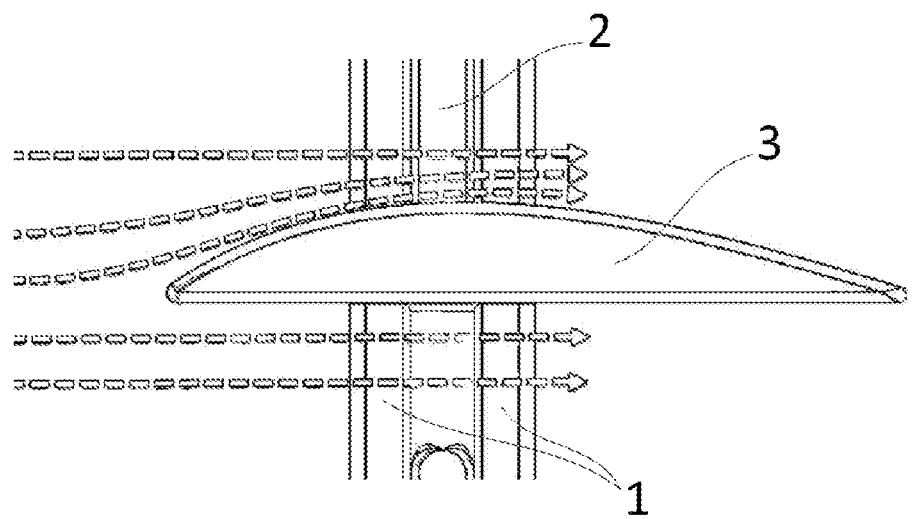
FIG. 3B is a schematic diagram of a lifting wing blown by an airflow.
Figure 4A:
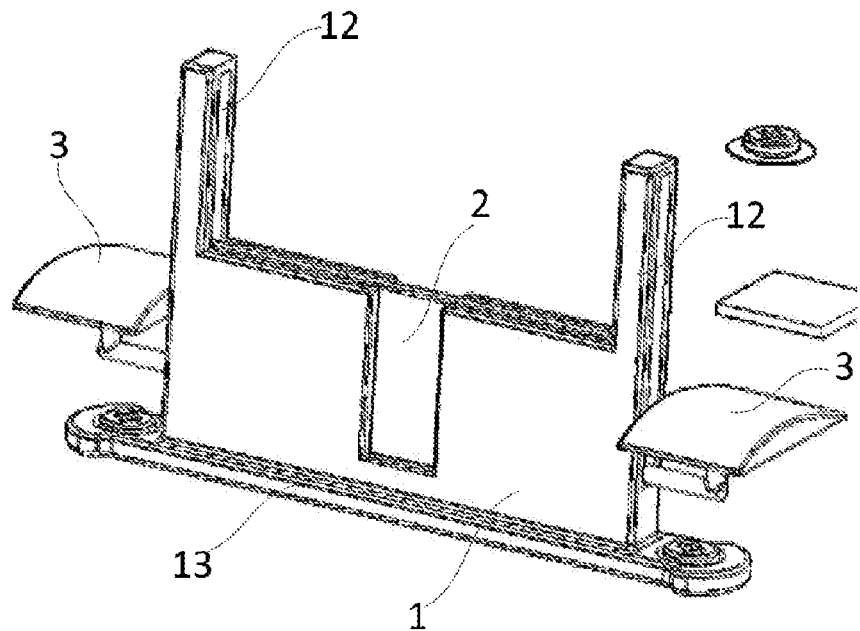
FIGS. 4A to 4D are schematic state diagrams showing the transition of a rectangular plate from a lowest position to a highest position, respectively.
Figure 4B:
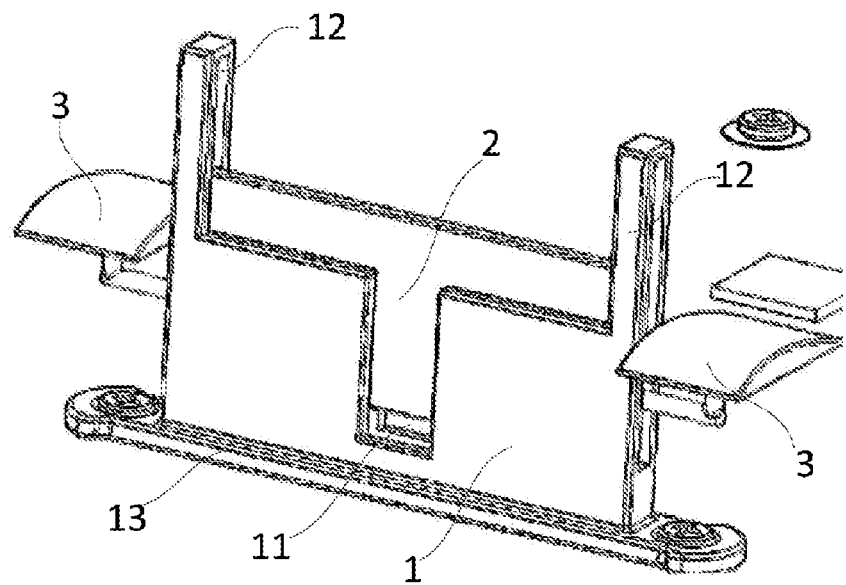
Figure 4C:
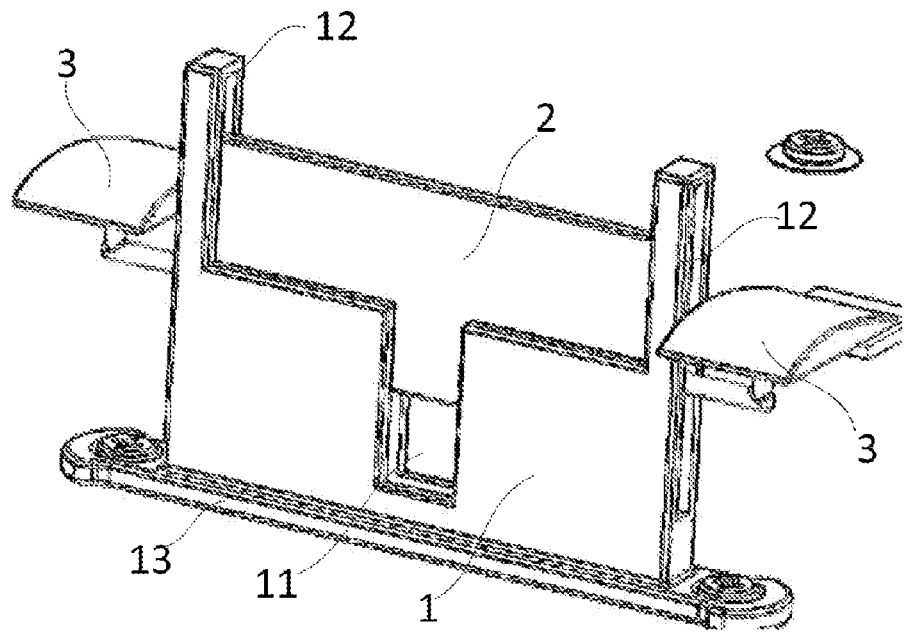
Figure 4D:
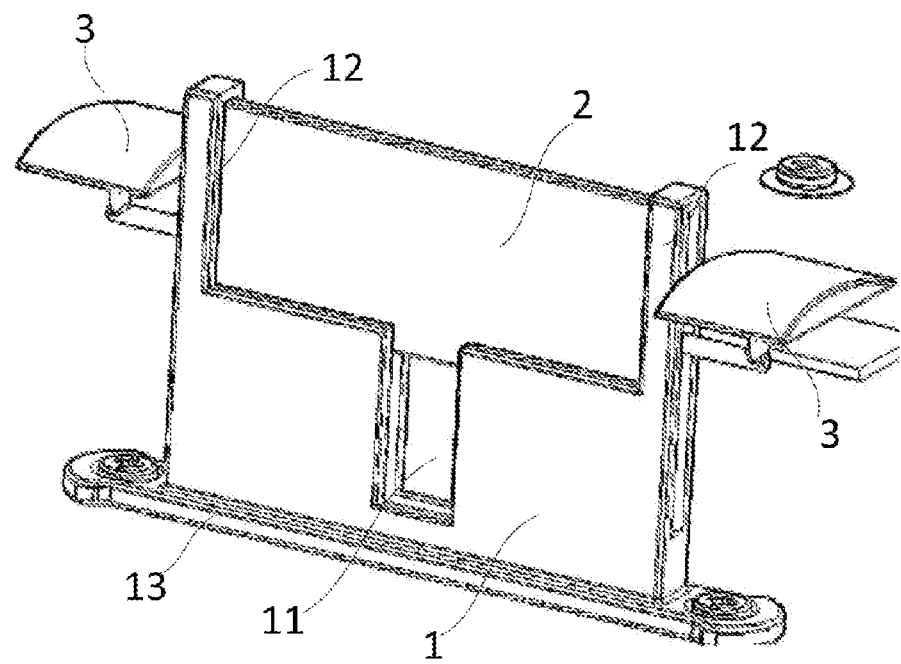

A lifting wing 3 is arranged on the rectangular plate 2. The lifting wing 3 is blown by the airflow to generate upward lifting force, and when the wind force is strong enough, the rectangular plate 2 is driven to move upwards to shield an opening in an upper portion of the windshield 1 and block the airflow. As shown in FIG. 3A, which is a schematic structural diagram of the airflow regulation and control apparatus blown by the airflow according to the present disclosure, the arrow in the figure indicates the airflow. FIG. 3B is a schematic diagram of the lifting wing 3 blown by the airflow, equivalent to a partial view in the side direction of FIG. 3A, and the arrow in the figure indicates the airflow. A curvature of an upper surface of a vertical section of the lifting wing 3 is greater than a curvature of a lower surface. Therefore, when the airflow blows horizontally, the airflow velocity on the upper surface is faster and the airflow velocity on the lower surface is slower, and air pressure difference is generated due to the different airflow velocities, which generates the upward lifting force on the lifting wing 3 and enables the lifting wing 3 to move upward. The lifting wing 3 and the rectangular plate 2 are relatively fixedly arranged, thus driving the rectangular plate 2 to move upwards.

When the rectangular plate 2 moves upwards, as shown in FIG. 2, an overlapping part of the rectangular plate 2 and the windshield 1 is reduced, the rectangular plate 2 and the windshield 1 together form a wind blocking surface with a larger area, and an overall height of the wind blocking surface is higher, which plays a stronger role in blocking the airflow. Meanwhile, since the ventilation hole 11 is no longer shielded after the rectangular plate 2 is upwards lifted, the airflow may be blown to a position behind the windshield 1 via the ventilation hole 11, thus cooling a component behind the windshield, and the airflow blown to a rear via the ventilation hole 11 is far less than the airflow blown to a front of the wind blocking surface of the rectangular plate 2 and windshield 1.

Excess airflow flows from an upper portion and both sides of the wind blocking surface defined by the windshield 1 and the rectangular plate 2, and blows to the component with a higher calorific value. The excess airflow is supplied to another component with a higher calorific value, and the airflow is redistributed. The excess airflow is led to another component needing more airflow in the case where the component behind the windshield 1 fully radiates the heat, so that the airflow is utilized more reasonably, energy waste is reduced, and the effect of reducing energy consumption is achieved.

When in use, when the fan blows a small amount of the airflow, the lifting wing 3 may not generate enough lifting force. At this time, the rectangular plate 2 is kept at the lower portion under the action of gravity. At this time, the windshield 1 and the rectangular plate 2 overlap each other, and the height of the integrally formed wind blocking surface is low. The airflow bypasses an upper edge of the windshield 1 to blow to the component behind the windshield 1, thus achieving a cooling effect. Since the component behind the windshield 1 has a low calorific value, cooling and heat dissipation may be realized with only a small amount of the airflow.

When the calorific value increases, the airflow blown by the fan increases, as shown in FIGS. 4A to 4D, which are schematic state diagrams of transition of the rectangular plate 2 from a lowest position to a highest position. When the rectangular plate 2 moves upwards, the ventilation hole 11 is gradually opened, finally the ventilation hole 11 is not shielded at all, and the airflow goes through the ventilation hole 11 to ensure the cooling effect of the component in the rear. Other airflow is shielded by the windshield 1, and may not be directly blown to the component behind the windshield 1, but may only flow from the upper portion and left and right sides, and this part of shielded airflow mainly blows to another component with the higher calorific value.

In the present disclosure, the airflow is redistributed through the mutual cooperation between the rectangular plate 2 capable of sliding up and down and the ventilation hole 11, so that the airflow directly blowing to a rear portion of the windshield 1 is reduced and the airflow blowing to other portions is increased.

On the basis of the above solution, the lifting wing 3 may adopt a shape that the upper surface is a curved surface and the lower surface is a flat surface. The upper surface has a low airflow velocity, while the lower surface has a high airflow velocity. Different airflow velocities generate air pressure difference, which generates upward lifting force for the lifting wing 3.

In the present disclosure, there are two lifting wings 3, which are located on both sides of the rectangular plate 2, respectively. A height of the lifting wings 3 is lower than a height of an upper edge of the rectangular plate 2. When the rectangular plate 2 moves to the uppermost position, the lifting wings 3 do not occupy vertical space, thus ensuring the reasonable utilization of space.

In an embodiment mode, in the present disclosure, the windshield 1 is arranged in two layers, the rectangular plate 2 is sandwiched between the two layers, and the rectangular plate 2 only moves up and down due to the limitation of both sides.

In an embodiment mode, in the present disclosure, both sides of the windshield 1 protrude upwards and are provided with a guide rail 12, and the guide rail 12 is likewise a two-layer structure with an enclosed upper end part. The guide rail 12 may limit the highest position of the rectangular plate 2.

In an embodiment mode, in the present disclosure, the width of the ventilation hole 11 is less than one third of the width of the windshield 1, and it is best to set the ventilation hole 11 in the middle of the windshield 1, symmetrically about a symmetry axis of the windshield 1. The height of the ventilation hole 11 is smaller than the height of the windshield 1, and a top end of the ventilation hole 11 is communicated with the outside. That is, the top end of the ventilation hole 11 extends to a edge position in a middle of the windshield 1.

Specially, in the present disclosure, a base 13 is arranged on a lower surface of the windshield 1, and a thickness of the base 13 is greater than a thickness of the windshield 1, thus increasing the stability of the windshield 1.

Both ends of the base 13 in a length direction respectively extend out of the windshield 1 to form connecting lugs, through holes are formed in the connecting lugs, and the windshield 1 is fixed to the main board in a bolted manner through the connecting lugs, thus ensuring the connection stability.

The present disclosure also provides a server, including the airflow regulation and control apparatus described above. The structure of other parts of the server may be referred to the traditional art, which will not be repeated here in the present disclosure.

A flow guiding cover is arranged inside the server. The flow guiding cover is arranged on one side or both sides of the windshield 1, and is configured to lead airflow to blow to the component with a higher calorific value, so that the flow direction of the airflow is guided and the airflow is better supplied to another component. The flow guiding cover may adopt a tapered cylindrical structure, with smooth transition everywhere and no sharp corners, thus reducing the resistance to the airflow.

The above-mentioned description of the disclosed embodiments enables those skilled in the art to make or use the application. Multiple modifications to these embodiments are apparent to those skilled in the art, and the general principles defined herein can be implemented in other embodiments without departing from the spirit or scope of the present disclosure. Therefore, the application will not be limited to these embodiments shown herein, but is to be incorporated into the widest scope consistent with the principles and novel features disclosed herein.

What is claimed is:

1. An airflow regulation and control apparatus, comprising a windshield, wherein a ventilation hole is formed in the windshield in a penetrating manner;
    a rectangular plate being slidingly mounted on the windshield, the rectangular plate being capable of moving vertically relative to the windshield;
    and a lifting wing being arranged on the rectangular plate, and the lifting wing being blown by an airflow to generate upward lifting force, and driving the rectangular plate to upwards moved upwardly so as to shield an opening in an upper portion of the windshield and block the airflow, so that the airflow flows through the ventilation hole and an upper portion and both sides of a wind blocking surface defined by the windshield and the rectangular plate.

2. The airflow regulation and control apparatus according to claim 1, wherein an upper surface of the lifting wing is a curved surface and a lower surface of the lifting wing is a flat surface.

3. The airflow regulation and control apparatus according to claim 1, wherein there are two lifting wings, the two lifting wings are respectively located at both sides of the rectangular plate, a height of the lifting wings being lower than a height of an upper edge of the rectangular plate.

4. The airflow regulation and control apparatus according to claim 1, wherein the windshield is arranged in two layers, the rectangular plate being sandwiched between the two layers.

5. The airflow regulation and control apparatus according to claim 1, wherein both sides of the windshield protrude upwards and are provided with a guide rail, the guide rail being capable of limiting the highest position of the rectangular plate.

6. The airflow regulation and control apparatus according to claim 5, wherein a width of the ventilation hole is less than one third of a width of the windshield, a height of the ventilation hole being less than a height of the windshield, and a top end of the ventilation hole being communicated with the outside.

7. The airflow regulation and control apparatus according to claim 1, wherein a base is arranged on a lower surface of the windshield, a thickness of the base being greater than a thickness of the windshield.

8. The airflow regulation and control apparatus according to claim 7, wherein both ends of the base in a length direction respectively extend out of the windshield to form connecting lugs, the windshield being fixed to a main board in a bolted manner through the connecting lugs.

9. A server, comprising the airflow regulation and control apparatus according to claim 1.

10. The server according to claim 9, wherein one side or both sides of the windshield are provided with a flow guiding cover, the flow guiding cover being configured to lead airflow to blow to a component with a higher calorific value.

11. The server according to claim 10, wherein the flow guiding cover is a tapered cylindrical structure.

12. The server according to claim 10, wherein the airflow regulation and control apparatus is arranged in front of the component.

13. The server according to claim 9, wherein the server comprises a main board, the windshield is fixedly arranged.

14. The server according to claim 13, wherein the windshield is approximately perpendicular to a surface of the main board.

15. The airflow regulation and control apparatus according to claim 1, wherein a penetrating direction of the ventilation hole is perpendicular to the wind blocking surface of the windshield.

16. The airflow regulation and control apparatus according to claim 1, wherein a width of the ventilation hole is smaller than a width of the windshield.

17. The airflow regulation and control apparatus according to claim 1, wherein the ventilation hole in a middle of the windshield.

18. The airflow regulation and control apparatus according to claim 17, wherein the ventilation hole is symmetrically relative to a symmetry axis of the windshield.

19. The airflow regulation and control apparatus according to claim 1, wherein a curvature of an upper surface of a vertical section of the lifting wing is greater than a curvature of a lower surface of the vertical section of the lifting wing.

20. The airflow regulation and control apparatus according to claim 5, wherein the guide rail is a two-layer structure with an enclosed upper end part.

* * * * *